United States Patent
Son et al.

(10) Patent No.: US 10,212,865 B2
(45) Date of Patent: Feb. 19, 2019

(54) APPARATUS FOR MANUFACTURING DISPLAY DEVICE AND MANUFACTURING METHOD THEREOF

(71) Applicant: Samsung Display Co., Ltd, Yongin-si, Gyeonggi-do (KR)

(72) Inventors: Yang Han Son, Cheonan-si (KR); Sang Cheol Kim, Hwaseong-si (KR); Jae Young Kim, Asan-si (KR); Young Kuil Joo, Asan-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/455,852

(22) Filed: Mar. 10, 2017

(65) Prior Publication Data

US 2017/0265340 A1 Sep. 14, 2017

(30) Foreign Application Priority Data

Mar. 10, 2016 (KR) .................. 10-2016-0028940

(51) Int. Cl.
| | | |
|---|---|---|
| *H05K 13/00* | (2006.01) | |
| *H05K 5/00* | (2006.01) | |
| *H05K 5/03* | (2006.01) | |
| *G02F 1/13* | (2006.01) | |

(52) U.S. Cl.
CPC .......... *H05K 13/00* (2013.01); *G02F 1/1303* (2013.01); *H05K 5/0017* (2013.01); *H05K 5/03* (2013.01)

(58) Field of Classification Search
CPC ..... H05K 13/0023; H05K 5/0017; H05K 5/03
See application file for complete search history.

(56) References Cited

U.S. PATENT DOCUMENTS

| | | | | |
|---|---|---|---|---|
| 9,446,569 | B2* | 9/2016 | Lee | ................... B32B 37/0046 |
| 2014/0002975 | A1* | 1/2014 | Lee | ................... H05K 5/0017 |
| | | | | 361/679.01 |
| 2014/0299269 | A1 | 10/2014 | Son et al. | |
| 2014/0345791 | A1* | 11/2014 | Son | ................... B32B 37/0046 |
| | | | | 156/228 |
| 2014/0377508 | A1* | 12/2014 | Oh | ................... B32B 37/10 |
| | | | | 428/174 |

FOREIGN PATENT DOCUMENTS

| | | |
|---|---|---|
| CN | 104097383 A | 10/2014 |
| KR | 10-2014-0044579 A | 4/2014 |
| KR | 10-2014-0120568 A | 10/2014 |
| KR | 10-2015-0048547 A | 5/2015 |
| KR | 10-2015-0077164 A | 7/2015 |
| KR | 10-2015-0108481 A | 9/2015 |

* cited by examiner

*Primary Examiner* — Kevin Quarterman
(74) *Attorney, Agent, or Firm* — Innovation Counsel LLP

(57) ABSTRACT

A manufacturing apparatus of a display device that prevents generation of bubbles between a display panel and a cover window is presented. The apparatus includes a first jig that includes a first portion including a center and a second portion that includes a bend on at least one side of the first portion, and where a cover window is received; a second jig that faces the first portion of the first jig, wherein the cover window and a display panel are disposed between the first jig and the second jig; and a stopper detachably provided adjacent to an end of the second portion of the first jig.

7 Claims, 6 Drawing Sheets

APPARATUS FOR MANUFACTURING DISPLAY DEVICE AND MANUFACTURING METHOD THEREOF

CROSS-REFERENCE TO RELATED APPLICATION

This application claims priority to and the benefit of Korean Patent Application No. 10-2016-0028940 filed in the Korean Intellectual Property Office on Mar. 10, 2016, the entire content of which is incorporated herein by reference.

BACKGROUND (a) Field

The present disclosure relates to an apparatus for manufacturing a display device, and a method for manufacturing the display device. More particularly, the present disclosure relates to an apparatus for manufacturing a display device by attaching a display panel and a cover window to each other, and a method for manufacturing the display device.

(b) Description of the Related Art

Recently, a display device using a plastic substrate has been developed to offer advantages such as light weight, robustness against impact, and flexibility. The flexible display device can be folded or rolled in a scroll-like manner, allowing the flexible display device to be utilized in various fields.

The flexible display device includes a display element that is formed on a flexible substrate. An organic light emitting display element, a liquid crystal display element, and the like may be included as a display element that can be used in the flexible display device.

Such display elements commonly include a thin film transistor. Accordingly, the flexible substrate undergoes several thin film processes. The flexible substrate having undergone the thin film processes is sealed by an encapsulation layer. The flexible substrate, the thin film transistor formed in the flexible substrate, and the encapsulation layer form a display panel of the display device.

In general, a cover window that protects the display panel is attached to the entire surface of the display panel. In this case, an adhesive is provided between the display panel and the cover window such that the display panel and the cover window are bonded to each other.

Recently, a side-view display device that includes a main display area where a main image is displayed and an auxiliary display area that is disposed at a bent side portion and where a sub-image is disposed has been researched and developed. A cover window of the side-view display device has a structure in which a side portion of the display device is bent or curved.

When the side-bent cover window and the display panel are bonded to each other, bubbles may be generated between the cover window and the display panel.

The above information disclosed in this Background section is only for enhancement of understanding of the background of the concept and therefore it may contain information that does not form the prior art that is already known in this country to a person of ordinary skill in the art.

SUMMARY

The Embodiments of the disclosure are made in an effort to provide a manufacturing apparatus of a display device, which can prevent bubbles from being generated between a display panel and a cover window, and a manufacturing method thereof.

A manufacturing apparatus of a display device according to an exemplary embodiment of the present invention includes: a first jig that includes a first portion including a center and a second portion on at least one side of the first portion, the second portion including a bend to receive a cover window; a second jig that faces the first portion of the first jig, wherein the cover window and a display panel are disposed between the first jig and the second jig; and a stopper detachably provided adjacent to an end of the second portion of the first jig.

The first jig may include a stepped portion that has a shape that is formed by cutting a corner of the end of the second portion.

The stopper may include: a first limiter that protrudes toward a center of the first jig from the end of the second portion of the first jig; and a second limiter that protrudes in a direction that is non-parallel to the protrusion direction of the first limiter and engages with the stepped portion of the first jig.

The manufacturing apparatus of the display device may further include a stopper driver that is capable of moving the stopper.

The stopper may be made of a material that is slippery.

The stopper may be made of one of plastic, rubber, and a metal, and a surface of the stopper is coated with a material that is slippery.

The manufacturing apparatus of the display device may further include clamps that support the display panel at lateral sides of the second jig.

According to another exemplary embodiment of the present invention, a method for manufacturing a display device is provided. The method for manufacturing a display device includes: aligning a display panel and a cover window to face each other, the cover window including a planar portion and a curved portion that is provided in at least one side of the planar portion; preventing the display panel from contacting ends of lateral sides of the cover window by providing a stopper between the display panel and an end of the curved portion of the cover window; contacting the display panel and the planar portion of the cover window; removing the stopper from between the display panel and the end of the curved portion of the cover window; and contacting the display panel to the curved portion of the cover window.

The method for manufacturing a display device may further include separating the clamp from the display panel after the display panel and the planar portion of the cover window contact each other.

The display panel and the cover window may contact each other from a center portion of the cover window.

The aligning of the cover window and the display panel to face each other may include: receiving the cover window in a first jig that matches the shape of the cover window; and locating the display panel on the second jig that faces the first jig by coupling clamps to lateral ends of the display panel.

The contacting of the display panel and the planar portion of the cover window may include: moving the clamp close to the second jig; and moving the second jig toward the first jig.

The contacting of the display panel and the planar portion of the cover window may further include moving the first jig to the second jig.

The manufacturing method of the display device may further include separating the clamp from the display panel after the display panel and the planar portion of the cover window contact each other.

When the clamp is separated from the display panel, the ends of the curved portion of the cover window and the display panel may be prevented from contacting each other by the stopper.

The manufacturing method of the display device may further include bonding the display panel and the cover window by applying pressure thereto after the display panel and the curved portion of the cover window are bonded to each other.

According to the exemplary embodiment of the present invention, generation of bubbles between the display panel and the cover window in the bonding process of the display panel and the cover window can be prevented, and accordingly a yield of the product can be improved.

DETAILED DESCRIPTION

Figure 1:
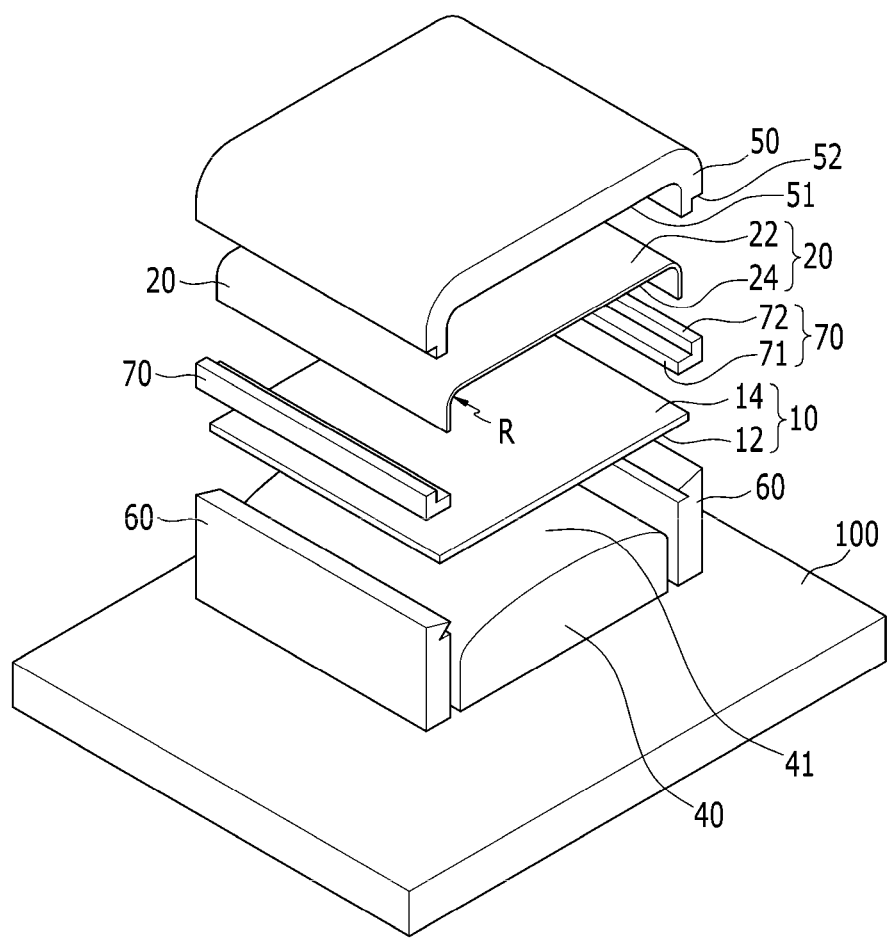
FIG. 1 shows a manufacturing apparatus of a display device according to an exemplary embodiment.

The Embodiment of the present inventive concept will be described more fully hereinafter with reference to the accompanying drawings, in which exemplary embodiments are shown. As those skilled in the art would realize, the described embodiments may be modified in various different ways, all without departing from the spirit or scope of the present disclosure.

Further, in the exemplary embodiments, since like reference numerals designate like elements having the same configuration, a first exemplary embodiment is described in detail, and other embodiments are described with a focus on their differences s from the first exemplary embodiment.

Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

Hereinafter, a manufacturing apparatus of a display device according to an exemplary embodiment will be described in detail with reference to FIG. 1.

FIG. 1 shows a manufacturing apparatus of a display device according to an exemplary embodiment.

Referring to FIG. 1, a manufacturing apparatus of a display device includes a first jig, a second jig, a clamp 60, and a stopper 70. The first jig and the second jig may be an upper jig 50 and a lower jig 40, respectively. The lower jig 40, the upper jig 50, the clamp 60, and the stopper 70 may be provided in a vacuum chamber (not shown) that provides a vacuum atmosphere.

The upper jig 50 includes a first portion that includes a center and a second portion that is bent at least on one side of the first portion. The first portion of the upper jig 50 may have a flat shape corresponding to a planar portion of a cover window 20, and the second portion of the upper jig 50 may have a curved shape corresponding to a curved portion R of the cover window 20. That is, the upper jig 50 includes a first receiving side that has a concave groove that corresponds to a first side 22 of the cover window 20, and a first receiving side 51 has a shape that matches the shape of the first side 22 of the cover window 20. The cover window 20 is received in the first receiving side 51 of the upper jig 50.

The cover window 20 may be made of transparent glass or plastic, and may have a side-bent structure that includes the planar portion and the curved portion R that is provided in at least one side of the planar portion.

In this case, the first receiving side 51 of the upper jig 50 is partially flat and partially curved such that the planar portion of the cover window 20 can be received in the partially flat portion and the curved portion R of the cover window 20 can be received in the partially curved portion.

The second portion of the upper jig 50 includes a stepped portion 52 that is provided for limiting movement of the stopper 70. The stepped portion 52 may be formed by perpendicularly cutting an outer end corner of the second portion of the upper jig 50.

The lower jig 40 is disposed facing the first portion of the upper jig 50, interposing a display panel 10 and the cover window 20 therebetween. The display panel 10 may include a touch panel (not shown), and may be flexible. The lower jig 40 includes a second receiving side 41 that corresponds to a first side 12 of the display panel 10. The second receiving side 41 may protrude toward the upper jig 50. The second receiving side 41 may have a shape that matches the first receiving side 51 of the upper jig 50. Alternatively, the second receiving side 41 may be curved. The first side 12 of the display panel 10 may be received in the second receiving side 41 of the lower jig 40.

The lower jig 40 may be close to or separated from the upper jig 50. That is, the lower jig 40 may rise to press against the display panel 10, which in turn presses against the cover window 20 while the display panel 10 is received therein. In this case, an adhesive (refer to reference numeral 11 of FIG. 2 to FIG. 6) such as an optically clear adhesive (OCA) is provided on a second side 14 of the display panel 10, and the second side 14 of the display panel 10 and a second side 24 of the cover window 20 may be bonded to each other by the adhesive. In addition, the lower jig 40 descends after the display panel 10 and the cover window 20 are bonded to each other such that the pressure applied to the display panel 10 and the cover window 20 may be released.

The lower jig 40 that is described is configured to move to or away from the upper jig 50. In other embodiments, the upper jig 50 may move to or away from the lower jig 40. Alternatively, the lower jig 40 and the upper jig 50 may both move to each other or away from each other.

The lower jig 40 is provided in a support 100. In this case, the lower jig 40 may be separable from the support 100, and the lower jig 40 may be replaced with various lower jigs.

The clamp 60 is provided at opposite sides of the lower jig 40, and supports the display panel 10 to be disposed on the lower jig 40. The clamp 60 may be provided at opposite sides of the lower jig 40 such that opposite sides of the display panel 10, respectively corresponding to opposite curved portions R of the cover window 20, can be supported.

The clamp 60 may move to or away from the lower jig 40. The clamps 60 at opposite sides of the lower jig 40 support opposite sides of the display panel 10 by being disposed at a distance that is the same as a width of the display panel 10 such that the display panel 10 can be maintained to be flat on the lower jig 40. Further, the clamps 60 move close to the lower jig 40 while supporting opposite sides of the display panel 10 such that the display panel 10 may have a convex surface raised toward the upper jig 50.

The stopper 70 is disposed adjacent to an end of the second portion of the upper jig 50. The stopper 70 may be provided to be movable away from the upper jig 50 from the end of the second portion or toward the end of the second portion of the upper jig 50 from an outer side of the upper jig 50. Thus, the stopper 70 is connected with a stopper driver 75 (refer to FIG. 5), and the stopper driver 75 may move the stopper 70 in a direction toward a center of the upper jig 50 from the outer side of the upper jig 50 or in the opposite direction.

The stopper 70 includes a first limiter 71 that protrudes in the direction of the center of the upper jig 50 from the end of the second portion of the upper jig 50, and a second limiter 72 that protrudes in a direction that crosses the protrusion direction of the first limiter 71 and is engaged with the stepped portion 52 of the upper jig 50. The first limiter 71 is inserted under the second end of the upper jig 50 and under the end of the cover window 20 which is received in the upper jig 50. The first limiter 71 serves to prevent the opposite ends of the cover window 20 from contacting the display panel 10. The second limiter 72 serves to limit movement of the stopper 70 toward a center direction of the upper jig 50. That is, when the stopper 70 moves in the direction of the center of the upper jig 50 from the outside of the upper jig 50, the second limiter 72 closes the stepped portion 52 of the upper jig 50 such that the movement of the stopper 70 is stopped.

The stopper 70 is provided at opposite sides of the upper jig 50 to prevent the opposite ends of the cover window 20 from contacting the display panel 10. The stopper 70 is inserted to the bottom of the opposite ends of the cover window 20 that is received in the upper jig 50 and the stopper 70 is disposed between the display panel 10 and the opposite ends of the cover window 20, and thus the display panel 10 and the opposite ends of the cover window 20 can be prevented from contacting each other by the stoppers 70 while the display panel 10 and the cover window 20 are bonded to each other.

In addition, when the display panel 10 contacts the curved portion R of the cover window 20 after contacting the planar portion of the cover window 20, the stoppers 70 separate from between the opposite ends of the cover window 20 and the display panel 10 such that the display panel 10 can contact the curved portion R of the cover window 20.

That is, when the display panel 10 and the planar portion of the cover window 20 are bonded to each other, the stopper 70 prevents the display panel 10 and the opposite ends of the cover window 20 from contacting each other, and when the display panel 10 and the curved portion R of the cover window 20 are bonded to each other, the stopper 70 is separated from under the end of the cover window 20 such that the display panel 10 can contact the curved portion R of the cover window 20.

The stopper 70 may be provided as a material that is slippery and not bonded by an adhesive that is provided for bonding the display panel 10 and the cover window 20. Alternatively, the stopper 70 may be made of a material such as plastic, rubber, a metal, and the like, and the surface of the stopper 70 may be coated by a material that is slippery and not bonded by the adhesive.

Although it is not illustrated, at least one of the lower jig 40 and the upper jig 50 may be connected with a pressure driver (not shown) that generates a pressure driving force. The pressure driver may be capable of vertically moving at least one of the lower jig 40 and the upper jig 50. The clamps 60 at opposite sides of the lower jig 40 may be connected to a clamp driver (not shown) for movement of the clamps 60. The clamp driver may be capable of horizontally moving the clamps 60. In addition, the stoppers 70 at opposite sides of the upper jig 50 may be connected to a stopper driver 75 (refer to FIG. 5) that is provided for moving the stopper 70. The pressure driver, the clamp driver, and the stopper driver 75 may be respectively provided as pneumatic cylinders, hydraulic cylinders, electric motors, and the like, which are well known, and no further detailed description will be provided.

Next, a process for bonding the display panel and the cover window by using the manufacturing apparatus of the display device according to the exemplary embodiment will be described with reference to FIG. 2 to FIG. 6.

Figure 2:
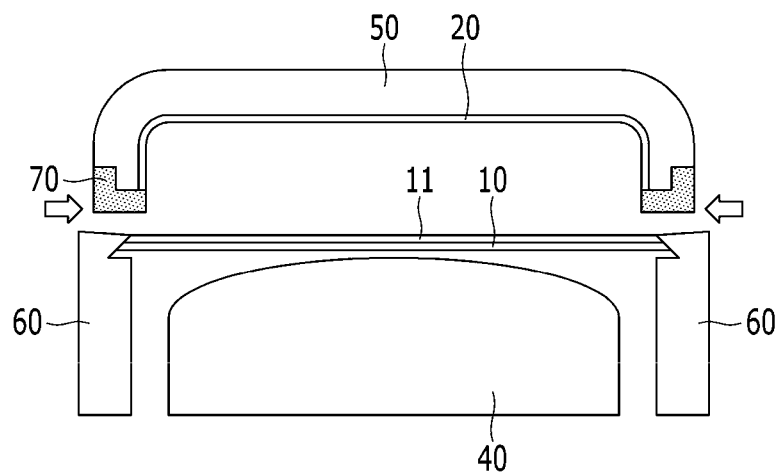
FIG. 2 shows a process for loading a display panel and a cover window to the manufacturing apparatus of the display device according to the exemplary embodiment.
Figure 3:
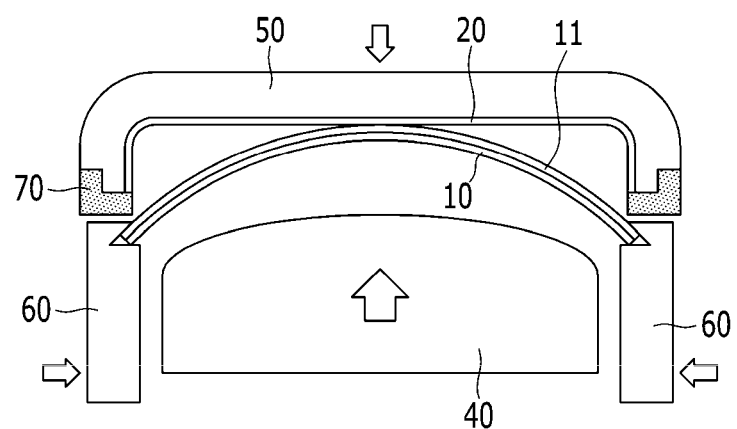
FIG. 3 shows a process of bonding the display panel and a center portion of the cover window in the manufacturing apparatus of the display device according to the exemplary embodiment.
Figure 4:
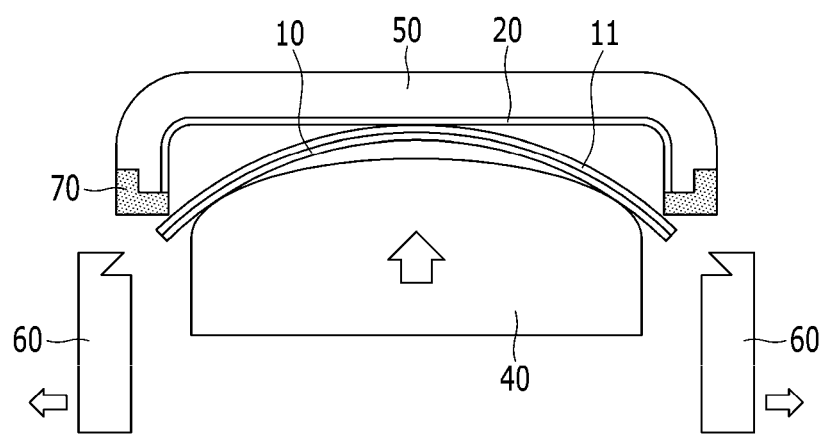
FIG. 4 shows a process during which a clamp is separated from the display panel in the manufacturing apparatus of the display device according to the exemplary embodiment.
Figure 5:
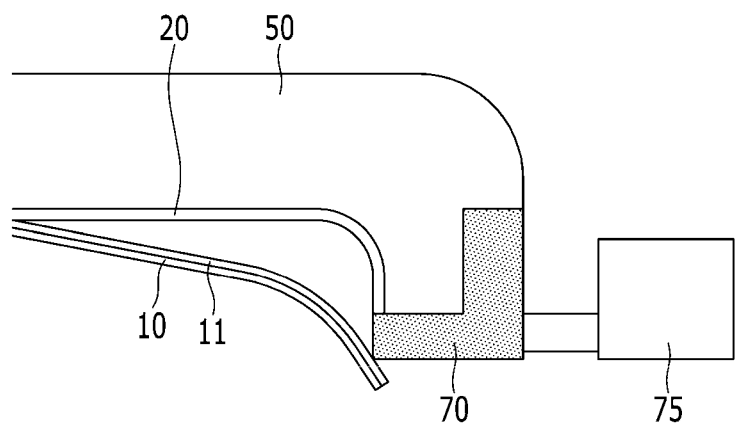
FIG. 5 shows a contact state of the display panel and the cover window in a state in which the clamp is separated from the display panel, which is shown in FIG. 4.
Figure 6:
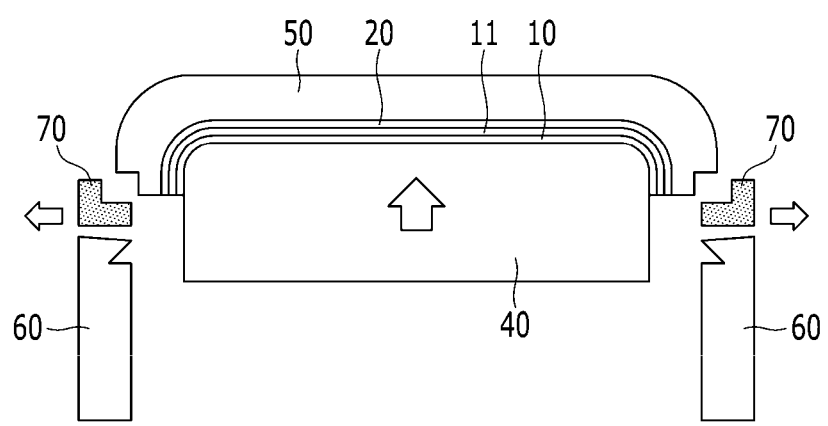
FIG. 6 shows a process for bonding the display panel to the side portion of the cover window in the manufacturing apparatus of the display device according to an exemplary embodiment.

FIG. 2 shows a process for loading the display panel and the cover window to the manufacturing apparatus of the display device according to the exemplary embodiment. FIG. 3 shows a process bonding of the display panel and a center portion of the cover window in the manufacturing apparatus of the display device according to the exemplary embodiment. FIG. 4 shows a process for separating the clamp from the display panel in the manufacturing apparatus of the display device according to the exemplary embodiment. FIG. 5 shows a contact state of the display panel and the cover window while the clamp is separated from the display panel of FIG. 4. FIG. 6 shows a process for bonding the display panel to the side portion of the cover window in the manufacturing apparatus of the display device according to the exemplary embodiment.

Referring to FIG. 2, the cover window 20 is received in the upper jig 50. The stoppers 70 are inserted below the upper jig 50 at opposite sides of the upper jig 50 where the cover window 20 is received. The stoppers 70 move in a direction of the center of the upper jig 50 from the outside of the upper jig 50 and are thus inserted to the bottom ends of the curved portion of the cover window 20.

The clamps 60 at the opposite sides of the lower jig 40 are coupled to opposite ends of the display panel 10 so as to dispose the display panel 10 on the lower jig 40. In this case, an adhesive 11 such as an OCA is provided on the display panel 10. The display panel 10 is disposed facing the cover window 20. Accordingly, the stoppers 70 are provided between the display panel 10 and opposite ends of the curved portion of the cover window 20 such that the display panel 10 and the cover window 20 are ready to be bonded to each other.

Referring to FIG. 3, when the display panel 10 and the cover window 20 are ready to be bonded to each other, the clamps 60 move toward each other, causing the display panel 10 to bend such that its center portion is closer to the center of the cover window 20. In this case, the lower jig 40 may rise to guide the display panel 10 to be convex upward.

The upper jig 50 moves toward the loser jig 40 such that the center of the planar portion of the cover window 20 contacts a convex, curved center portion of the display panel 10. An upper center portion of the display panel 10 and a lower center portion of the cover window 20 may be bonded to each other by the adhesive 11. That is, the display panel 10 is bonded with the cover window 20 from the center of the cover window 20.

Referring to FIG. 4 and FIG. 5, after the display panel 10 is bonded with the cover window 20 from the center of the cover window 20, the clamps 60 are separated from the display panel 10. The clamps 60 separated from the display panel 10 move in a direction away from the lower jig 40.

In addition, the lower jig 40 moves toward the upper jig 50 even closer, pressing the display 10 toward the cover window 20 such that an area where the display panel 10 and the cover window 20 contact each other expands more to the outside.

In this case, the stoppers 70 are provided at the bottom ends of the opposite sides of the cover window 20, and the ends of the curved portion of the cover window 20 and the display panel 10 are prevented from contacting each other by the stoppers 70. Although the display panel 10 partially contacts the stoppers 70, the display panel 10 is prevented from contacting the opposite ends of the cover window 20. The surface of the stoppers 70 may be coated by a material that is slippery and not bonded by the adhesive 11 such as an OCA.

Referring to FIG. 6, the lower jig 40 moves closer toward the upper jig 50, and the area of contact between the display panel 10 and the cover window 20 increases to as large as the planar portion of the cover window 20. At some point, the stoppers 70 are separated from the opposite sides of the upper jig 50. That is, the stoppers 70 escape from the bottom ends of the opposite sides of the cover window 20 and the display panel 10 contacts the lateral curved portions of the cover window 20. Since the stoppers 70 leave the area between the display panel 10 and the ends of the curved portions of the cover window 20 (see FIG. 5), the display panel 10 contacts the lateral curved portions of the cover window 20.

The lower jig 40 presses the display panel 10 and the cover window 20 with a predetermined pressure such that the display panel 10 and the cover window 20 are completely bonded to each other from the center portion of the cover window 20 to the side portions thereof by the adhesive 11. The side portions of the cover window 20 imply portions from the curved portions of the cover window 20 to the ends of the cover window 20.

As described above, the manufacturing apparatus of the display device can prevent the display panel 10 from contacting the cover window 20 from the opposite ends of the cover window 20 by using the stoppers 70 in the bonding process of the display panel 10 and the cover window 20. Accordingly, generation of bubbles in the curved portions at the opposite sides of the display device can be prevented.

If no stopper 70 is used, the display panel 10 contacts not only the center portion of the cover window 20 but also the ends of the opposite sides of the cover window 20 when the clamps 60 are separated from the display panel 10. If the lower jig 40 moves toward the upper jig 50 while the display panel 10 contacts the ends of the opposite sides of the cover window 20 such that the display panel 10 and the ends of the cover window 20 are bonded, the surface of the adhesive 11 of the display panel 10 may be disturbed and bubbles may be generated in the side portions of the cover window 20.

In addition, when the lower jig 40 moves toward the upper jig 50 while the display panel 10 contacts the ends of the opposite sides of the cover window 20 first, the display panel 10 and the cover window 20 need to be bonded to each other with a much greater pressure force due to an adhesion force of the adhesive 11. In such a case, the display panel 10 or the cover window 20 may be damaged due to the pressure force.

In particular, as a curvature ratio of the curved portion of the cover window 20 is small and a length of the side portion of the cover window 20 is increased, the display panel 10 contacts the cover window 20 from the ends of the opposite sides of the cover window 20, thereby causing generation of bubbles or damage to a product.

When the manufacturing apparatus of the display device is used, bubbles are hardly generated even through the display panel 10 is bonded to the cover window 20 of which a curvature ratio of lateral curved portions is 2.8 mm and the side portion is bent at 90 degrees with respect to the planar portion. However, when the stoppers 70 are not used, yield of the display device is deteriorated due to generation of bubbles.

While the above description is provided in connection with what is presently considered to be practical example embodiments, it is to be understood that the inventive concept is not limited to the disclosed embodiments, but, on the contrary, is intended to cover various modifications and equivalent arrangements included within the spirit and scope of the appended claims. Therefore, it will be appreciated by those skilled in the art that various modifications may be made and other equivalent embodiments are available. Therefore, a true technical scope of the present disclosure will be defined by the technical spirit of the appended claims.

What is claimed is:

1. A manufacturing apparatus of a display device, comprising:
   a first jig that includes a first portion including a center and a second portion on at least one side of the first portion, the second portion including a bend to receive a cover window;
   a second jig that faces the first portion of the first jig, wherein the cover window and a display panel are disposed between the first jig and the second jig;
   clamps holding the display panel on opposite ends of the second jig; and
   a stopper detachably provided adjacent to an end of the second portion of the first jig,
   wherein the stopper prevents opposite ends of the cover window from contacting the display panel when the clamps are separated from the display panel.

2. The manufacturing apparatus of the display device of claim 1, wherein the first jig comprises a stepped portion that is formed by cutting a corner of the end of the second portion.

3. The manufacturing apparatus of the display device of claim 2, wherein the stopper comprises:
   a first limiter that protrudes toward a center of the first jig from the end of the second portion of the first jig; and
   a second limiter that protrudes in a direction that is non-parallel to the protrusion direction of the first limiter and engages with the stepped portion of the first jig.

4. The manufacturing apparatus of the display device of claim 1, further comprising a stopper driver that is capable of moving the stopper.

5. The manufacturing apparatus of the display device of claim 1, wherein the stopper is not bonded by an adhesive to the display panel.

6. The manufacturing apparatus of the display device of claim 1, wherein the stopper is made of one of plastic, rubber, and a metal.

7. The manufacturing apparatus of the display device of claim 1, wherein the stopper is made of one of plastic, rubber, and a metal.

* * * * *